(12) United States Patent
Hsiao et al.

(10) Patent No.: US 9,960,136 B2
(45) Date of Patent: *May 1, 2018

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Yu-Hsiang Hsiao, Kaohsiung (TW); Chiu-Wen Lee, Kaohsiung (TW); Ping-Feng Yang, Kaohsiung (TW); Kwang-Lung Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/239,745

(22) Filed: Aug. 17, 2016

(65) Prior Publication Data
US 2016/0358875 A1 Dec. 8, 2016

Related U.S. Application Data

(63) Continuation of application No. 14/639,535, filed on Mar. 5, 2015, now Pat. No. 9,443,813.

(51) Int. Cl.
*H01L 23/00* (2006.01)
*B23K 1/00* (2006.01)
(Continued)

(52) U.S. Cl.
CPC ............ *H01L 24/13* (2013.01); *B23K 1/0016* (2013.01); *B23K 35/262* (2013.01);
(Continued)

(58) Field of Classification Search
CPC ......... H01L 24/13; H01L 24/05; H01L 24/81; H01L 25/50; H01L 25/0657;
(Continued)

(56) References Cited

U.S. PATENT DOCUMENTS

| 8,592,995 B2 | 11/2013 | Lin et al. |
| 2004/0023487 A1 | 2/2004 | Shiomi et al. |

(Continued)

FOREIGN PATENT DOCUMENTS

| CN | 1460292 A | 12/2003 |
| CN | 102254871 A | 11/2011 |

(Continued)

OTHER PUBLICATIONS

English Translation of Search Report for Taiwan Patent Application No. 105105050, dated Apr. 27, 2017, 1 page.
Office Action and Search Report for Taiwan Patent Application No. 105105050, dated Apr. 27, 2017, 3 pages.
Office Action and Search Report for Chinese Patent Application No. 201610120953.0, dated Mar. 3, 2017, 7 pages.
Translation of Search Report for Chinese Patent Application No. 201610120953.0, dated Mar. 3, 2017, 2 pages.

*Primary Examiner* — Long Pham
(74) *Attorney, Agent, or Firm* — Foley & Lardner LLP; Cliff Z. Liu

(57) ABSTRACT

A semiconductor device includes a first circuit layer, a copper pillar disposed adjacent to the first circuit layer, a second circuit layer and a solder layer. The second circuit layer includes an electrical contact and a surface finish layer disposed on the electrical contact, wherein a material of the surface finish layer is a combination of at least two of nickel, gold, and palladium. The solder layer is disposed between the copper pillar and the surface finish layer. The solder layer includes a first intermetallic compound (IMC) and a second IMC, wherein the first IMC includes a combination of two or more of copper, nickel and tin, and the second IMC includes a combination of gold and tin, a combination of palladium and tin, or both.

13 Claims, 4 Drawing Sheets

(51) Int. Cl.
  *B23K 35/26*   (2006.01)
  *B23K 35/30*   (2006.01)
  *C22C 9/02*    (2006.01)
  *C22C 13/00*   (2006.01)
  *H01L 25/065*  (2006.01)
  *H01L 25/00*   (2006.01)
  *B23K 101/40*  (2006.01)

(52) U.S. Cl.
  CPC .............. *B23K 35/302* (2013.01); *C22C 9/02* (2013.01); *C22C 13/00* (2013.01); *H01L 24/05* (2013.01); *H01L 24/81* (2013.01); *H01L 25/0657* (2013.01); *H01L 25/50* (2013.01); *B23K 2201/40* (2013.01); *H01L 2224/0401* (2013.01); *H01L 2224/05147* (2013.01); *H01L 2224/13025* (2013.01); *H01L 2224/13147* (2013.01); *H01L 2224/13582* (2013.01); *H01L 2224/13611* (2013.01); *H01L 2224/13644* (2013.01); *H01L 2224/13647* (2013.01); *H01L 2224/13655* (2013.01); *H01L 2224/13664* (2013.01); *H01L 2224/8181* (2013.01); *H01L 2224/81193* (2013.01); *H01L 2224/81815* (2013.01); *H01L 2225/06513* (2013.01); *H01L 2225/06544* (2013.01); *H01L 2225/06565* (2013.01); *H01L 2225/06582* (2013.01); *H01L 2924/014* (2013.01); *H01L 2924/01029* (2013.01); *H01L 2924/01327* (2013.01); *H01L 2924/181* (2013.01); *H01L 2924/3512* (2013.01)

(58) Field of Classification Search
  CPC .. B23K 1/0016; B23K 35/262; B23K 35/302; C22C 9/02; C22C 13/00
  See application file for complete search history.

(56) References Cited

U.S. PATENT DOCUMENTS

| | | |
|---|---|---|
| 2011/0001250 A1 | 1/2011 | Lin et al. |
| 2011/0285023 A1* | 11/2011 | Shen ...................... H01L 24/03 257/773 |
| 2012/0256228 A1 | 10/2012 | Lin et al. |
| 2013/0241069 A1 | 9/2013 | Nakamura et al. |
| 2013/0302646 A1 | 11/2013 | Chen et al. |
| 2014/0183731 A1 | 7/2014 | Lin et al. |
| 2014/0256126 A1 | 9/2014 | Wang et al. |

FOREIGN PATENT DOCUMENTS

| | | |
|---|---|---|
| CN | 102800641 A | 11/2012 |
| CN | 103155127 A | 6/2013 |
| CN | 103390565 A | 11/2013 |
| TW | 201407734 A | 2/2014 |
| TW | 201426965 A | 7/2014 |
| TW | 201436071 A | 9/2014 |

* cited by examiner

SEMICONDUCTOR DEVICE AND METHOD FOR MANUFACTURING THE SAME

CROSS-REFERENCE TO RELATED APPLICATIONS

The present application is a continuation of U.S. patent application Ser. No. 14/639,535 filed Mar. 5, 2015, now U.S. Pat. No. 9,443,813 issued Sep. 13, 2016, the contents of which are incorporated herein by reference in their entirety.

BACKGROUND

1. Technical Field

The present disclosure relates to the field of semiconductor structure and semiconductor process, and more particularly, to semiconductor flip-chip bonded device and semiconductor process for manufacturing the same.

2. Description of the Related Art

In a conventional semiconductor flip-chip bonding method, a barrier layer of nickel (Ni) material is coated to a copper pillar of an upper die, and a solder is formed on the Ni barrier layer. Then, the upper die is placed on a bottom die or a substrate, so that the solder on the copper pillar contacts the pad of the bottom die or the substrate. After a reflow process, the solder is melted to join to the pad so as to form a semiconductor flip-chip bonded device.

During the reflow process, the solder may react with the pad of the bottom die or the substrate so as to form intermetallic compounds (IMC). Typically, the material of the solder is a tin silver alloy (e.g., SnAg), the material of the pad is copper (Cu), and the material of an IMC is thus a combination of tin, silver and copper, such as $Cu_6Sn_5$, $Ni_6Sn_5$, $Cu_3Sn_4$ or $Ni_3Sn_4$. IMCs can make the bonding between the solder and the pad tighter. However, if the pad is thin, the whole pad may react with the solder so that the pad cracks. In addition, a thicker IMC layer will reduce the shear strength of the semiconductor flip-chip bonded device because the IMCs are brittle. Moreover, if the solder is very thin (e.g., less than 30 μm), the volume ratio of the IMCs to the solder can exceed 80%, which can result in joint crack.

Thus, a new semiconductor device and semiconductor process for controlling amounts of IMCs are desirable.

SUMMARY

An aspect of the present disclosure relates to a semiconductor device and a method for manufacturing the same. The semiconductor device includes a semiconductor die, a semiconductor element and a solder layer. The semiconductor die includes a copper pillar. The semiconductor element includes a surface finish layer, wherein the material of the surface finish layer is a combination of at least two of nickel, gold, and palladium. The solder layer is disposed between the copper pillar and the surface finish layer. The solder layer includes a first intermetallic compound (IMC) and a second IMC. The first IMC includes a combination of copper, nickel and tin. The second IMC includes a combination of gold and tin, a combination of palladium and tin, or both.

Another aspect of the present disclosure relates to a semiconductor device. In an embodiment, the semiconductor device comprises a semiconductor die, a semiconductor element and a solder layer. The semiconductor die includes a copper pillar, a barrier layer and a metal layer. The barrier layer is disposed on a tip of the copper pillar, and the metal layer is disposed on the barrier layer. The semiconductor element includes an electrical contact and a surface finish layer disposed on the electrical contact. The material of the surface finish layer is a combination of two or more of nickel, gold and palladium. The solder layer is disposed between the metal layer of the semiconductor die and the surface finish layer of the semiconductor element. The solder layer includes a first IMC and a second IMC. The first IMC includes a combination of two or more of copper, nickel and tin. The second IMC includes a combination of gold and tin, palladium and tin, or both.

Another aspect of the present disclosure relates to a method for manufacturing a semiconductor device. In an embodiment, the method comprises (a) providing a semiconductor die comprising a copper pillar; (b) forming a solder layer adjacent to a tip of the copper pillar; (c) placing the semiconductor die on a semiconductor element such that the solder layer contacts a surface finish layer on an electrical contact of the semiconductor element, wherein the material of the surface finish layer is a combination of two or more of nickel, gold and palladium; and (d) performing a reflow process to form a first IMC and a second IMC in the solder layer, wherein the first IMC comprises a combination of copper, nickel and tin, and the second IMC includes a combination of gold and tin, a combination of palladium and tin, or both.

Another aspect of the present disclosure relates to a semiconductor device. In an embodiment, the semiconductor device includes a first circuit layer, a copper pillar disposed adjacent to the first circuit layer, a second circuit layer and a solder layer. The second circuit layer includes an electrical contact and a surface finish layer disposed on the electrical contact, wherein a material of the surface finish layer is a combination of at least two of nickel, gold, and palladium. The solder layer is disposed between the copper pillar and the surface finish layer. The solder layer includes a first intermetallic compound (IMC) and a second IMC, wherein the first IMC includes a combination of two or more of copper, nickel and tin, and the second IMC includes a combination of gold and tin, a combination of palladium and tin, or both.

Another aspect of the present disclosure relates to a semiconductor device. In an embodiment, the semiconductor device includes a first circuit layer including a protection layer exposing portions of the first circuit layer, and a seed layer disposed on the exposed portions of the first circuit layer. The semiconductor device further includes a copper pillar disposed on the seed layer, a second circuit layer including a pad and a surface finish layer disposed on the pad, and a solder layer disposed between the copper pillar and the surface finish layer. The semiconductor device further includes a first intermetallic compound between the solder layer and the copper pillar, and a second intermetallic compound between the solder layer and the surface finish layer, a volume of the first intermetallic compound plus a volume of the second intermetallic compound being less than eighty percent (80%) of a volume of the solder layer.

Another aspect of the present disclosure relates to a semiconductor device. In an embodiment, the semiconductor device includes a first circuit layer including a seed layer disposed on the first circuit layer, a copper pillar disposed on the seed layer, and a second circuit layer including a pad and a surface finish layer disposed on the pad. A material of the surface finish layer is a combination of at least two of nickel, gold, and palladium. A solder layer is disposed between the copper pillar and the surface layer. The solder layer includes a first intermetallic compound (IMC) and a second IMC, wherein a volume ratio of the first IMC to the solder layer is greater than a volume ratio of the second IMC to the solder layer.

DETAILED DESCRIPTION

Figure 1:
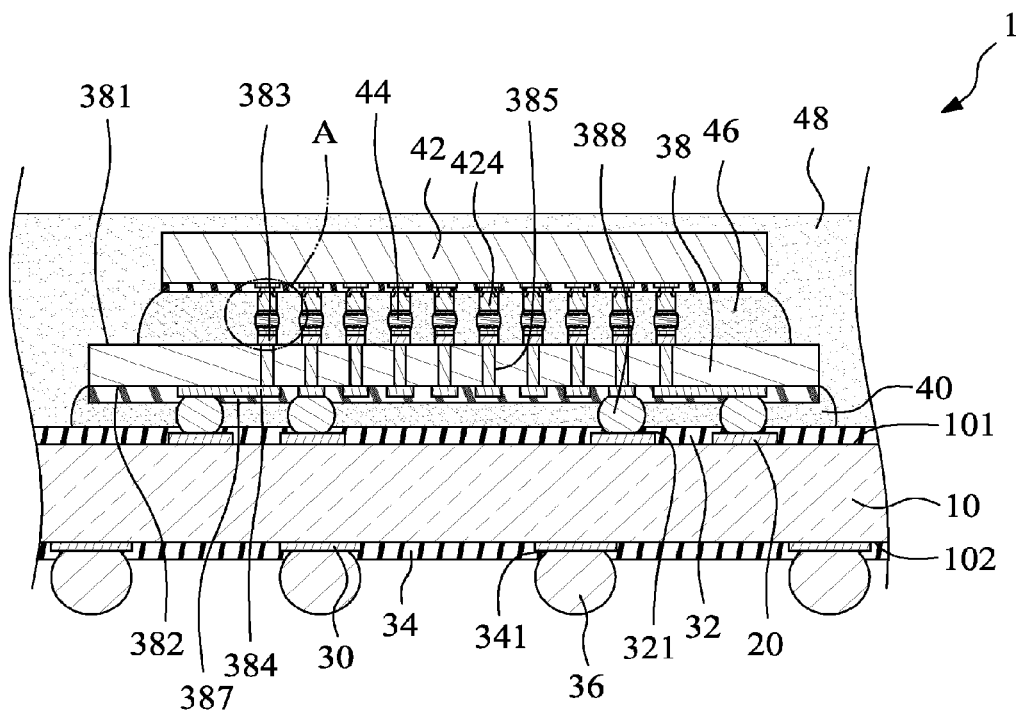
FIG. 1 illustrates a cross-sectional view of a semiconductor package according to an embodiment of the present disclosure.

Referring to FIG. 1, a cross-sectional view of a semiconductor package according to an embodiment of the present disclosure is illustrated. The semiconductor package 1 comprises a substrate 10, a plurality of external solder balls 36, a semiconductor die 42, a semiconductor element 38, a first underfill 40, a plurality of solder layers 44, a second underfill 46 and a molding compound 48.

The substrate 10 may be, for example, a silicon substrate, a wafer, or a glass substrate. The substrate 10 includes an upper surface 101, a lower surface 102, an upper circuit layer 20, a lower circuit layer 30, an upper protection layer 32 and a lower protection layer 34. The upper circuit layer 20 is disposed on the upper surface 101 of the substrate 10, and the lower circuit layer 30 is disposed on the lower surface 102 of the substrate 10. The upper protection layer 32 covers the upper circuit layer 20 and the upper surface 101 of the substrate 10, and defines a plurality of openings 321 to expose a portion of the upper circuit layer 20. The lower protection layer 34 covers the lower circuit layer 30 and the lower surface 102 of the substrate 10, and defines a plurality of openings 341 to expose a portion of the lower circuit layer 30. In an embodiment, the material of the upper circuit layer 20 and the lower circuit layer 30 is Cu, and the upper protection layer 32 and the lower protection layer 34 are solder masks, and the material thereof is, for example, polyimide (PI). The external solder balls 36 are disposed on the exposed lower circuit layer 30 for external connection.

The semiconductor element 38 may be, for example, a silicon substrate, a wafer or a glass substrate. In an embodiment, the semiconductor element is an interposer. The semiconductor element includes an upper surface 381, a lower surface 382, an upper circuit layer 383, a lower circuit layer 384, a plurality of conductive vias 385, a lower protection layer 387 and a plurality of solder balls 388. The upper circuit layer 383 and the lower circuit layer 384 are disposed on the upper surface 381 and the lower surface 382 of the semiconductor element 38, respectively. The conductive vias 385 penetrate through the semiconductor element 38, and contact and electrically connect the upper circuit layer 383 and the lower circuit layer 384. The lower protection layer 387 covers the lower circuit layer 384 and the lower surface 382 of the semiconductor element 38, and defines a plurality of openings to expose a portion of the lower circuit layer 384. The solder balls 388 contact and electrically connect exposed portions of the lower circuit layer 384 of the semiconductor element 38 and exposed portions of the upper circuit layer 20 of the substrate 10. The first underfill 40 is disposed between the semiconductor element 38 and the substrate 10 for protecting the solder balls 388. In an embodiment, the lower protection layer 387 is a solder mask, and the material thereof is, for example, polyimide (PI).

The semiconductor die 42 is attached to the semiconductor element 38 by way of a plurality of copper pillars 424 on the semiconductor die 42. Each of the solder layers 44 is disposed between one of the copper pillars 424 and an exposed portion of the upper circuit layer 383 so as to bond the copper pillars 424 to the upper circuit layer 383. The second underfill 46 is disposed between the semiconductor die 42 and the semiconductor element 38 for protecting the copper pillars 424 and the solder layers 44. In some embodiments, rather than being copper, copper pillars 424 comprise a different metal, a metal alloy, or other conductive material, and the composition of the IMCs formed would accordingly be different.

The molding compound 48 is disposed on the upper surface 101 of the substrate 10 to encapsulate the semiconductor element 38, the first underfill 40, the semiconductor die 42 and the second underfill 46. In some embodiments, one or both of the first underfill 40 and the second underfill 46 may be omitted.

In the embodiment of FIG. 1, a semiconductor flip-chip bonded device comprises the semiconductor die 42 with copper pillars 424, the semiconductor element 38, and the solder layers 44.

Figure 2:
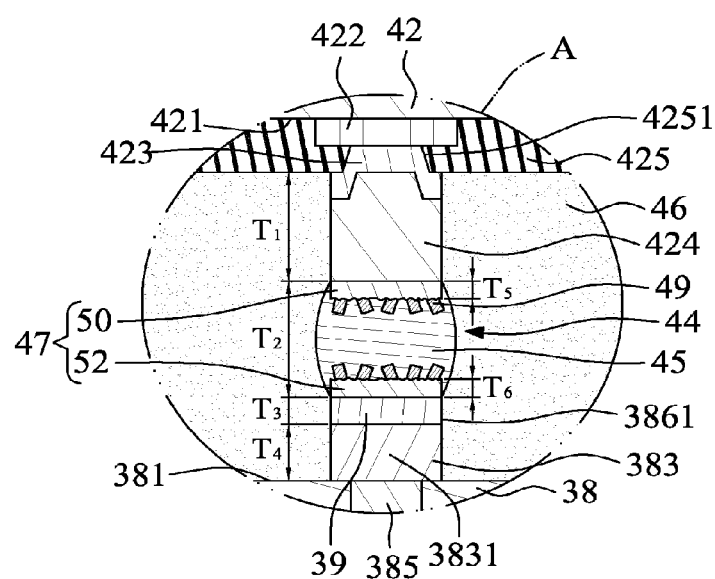
FIG. 2 illustrates an enlarged view of an area of a semiconductor flip-chip bond between a semiconductor die and a semiconductor element in the semiconductor package of FIG. 1.

Referring to FIG. 2, an enlarged view of area A of the semiconductor flip-chip bonded device of FIG. 1 is illustrated. As illustrated by the enlarged view of area A in FIG. 2, the semiconductor die 42 includes an active surface 421, a metal circuit layer 422, a seed layer 423, the copper pillars 424, and a protection layer 425. The metal circuit layer 422 is disposed on the active surface 421. In some embodiments, the metal circuit layer 422 includes a plurality of segments insulated from each other, and the material of the segments is, for example, aluminum (Al), Cu, or an alloy (e.g., AlCu). The protection layer 425 covers the active surface 421 and the metal circuit layer 422, and defines a plurality of openings 4251 to expose portions of the metal circuit layer 422. In an embodiment, the protection layer 425 is a passivation layer comprised of metal oxide. The copper pillars 424 are disposed adjacent to the metal circuit layer 422, and are electrically connected to the metal circuit layer 422. In the embodiment illustrated in FIGS. 1 and 2, the seed layer 423 is disposed on the metal circuit layer 422 in the openings 4251, and the copper pillars 424 are disposed on the seed layer 423. That is, a portion of the seed layer 423 is disposed between each of the copper pillars 424 and the metal circuit layer 422. However, the seed layer 423 may be omitted, and the copper pillars 424 may be disposed on the metal circuit layer 422 directly. In an embodiment, the material of the seed layer 423 is a titanium alloy (e.g., TiCu).

The semiconductor element 38 includes an electrical contact for electrically connecting to the semiconductor die 42. In the illustrated embodiment, a portion of the upper circuit layer 383 forms a pad 3831, which is the above-mentioned electrical contact. In this embodiment, the semiconductor element 38 includes a surface finish layer 39 disposed on the pad 3831, where the surface finish layer 39 is formed in one or more layers, such as layers of Ni, palladium (Pd), and gold (Au) (e.g. Ni/Au, Ni/Pd or Ni/Pd/Au), and the material of the pad 3831 is Cu. For example, a Ni layer of the surface finish layer 39 serves as a barrier layer which can block some of the Cu diffusion from the pad 3831 to the solder layer 44, to avoid a crack of the upper circuit layer 383 due to the consuming of the whole pad 3831. Additionally, Au, Pd or Pd/Au layer(s) of the surface finish layer 39 disposed on the Ni layer may be used to increase wettability of the solder layer 44, to avoid inadequate solder bonding due to poor wettability of the Ni layer.

The solder layer 44 is disposed between the copper pillar 424 and the surface finish layer 39, and, as manufactured, comprises a main solder portion 45, a first IMC 47 and a second IMC 49. In this embodiment, the solder layer 44 contacts the copper pillar 424 directly. The material of the main solder portion 45 is Sn or SnAg. The first IMC 47 and the second IMC 49 are a result of the metal interaction between the main solder portion 45 and the copper pillar 424, and between the main solder portion 45 and the pad 3831 with the finish layer 39. The first IMC 47 is a Cu, Ni, Sn combination, and the second IMC 49 is an Au, Sn combination such as $AuSn_4$, a Pd, Sn combination such as $PdSn_4$, or both an Au, Sn combination and a Pd, Sn combination. In an embodiment, the first IMC 47 includes $(Cu, Ni, Au, Pd)_6Sn_5$ (i.e., one or more of $Cu_6Sn_5$, $Ni_6Sn_5$, $Au_6Sn_5$ or $Pd_6Sn_5$) and other IMCs, and the second IMC 49 includes $(Au, Pd, Ni)Sn$ (i.e., one or more of $AuSn_4$, $PdSn_4$ or $NiSn_4$) and other IMCs.

The first IMC 47 includes a top layer 50 and a bottom layer 52 formed by metal interaction with the main solder portion 45. In an embodiment, the top layer 50 and the bottom layer 52 are the same material. The top layer 50 is formed at the tip of the copper pillar 424 from interaction of the main solder portion 45 and the copper pillar 424, and the bottom layer 52 is formed adjacent to the electrical contact (i.e., the pad 3831) from interaction of the solder layer 44 and the surface finish layer 39. In some embodiments, barrier layers may be disposed (e.g., coated) on one or both of the copper pillar 424 and the surface finish layer 39; however, in the embodiment illustrated in FIG. 2, such barrier layer can be omitted.

The second IMC 49 is also formed by metal interaction, and is formed discontinuously in the main solder portion 45, as indicated by the illustration in FIG. 2.

As described, in the embodiment of FIG. 2, no barrier layer, such as Ni layer, is disposed on the tip of the copper pillar 424. Thus, during the reflow process, the Cu in the copper pillar 424 and the Ni in the surface finish layer 39 will enter the solder layer 44 rapidly, so as to form the top layer 50 and the bottom layer 52 of the first IMC 47. Specifically, some of the Cu from copper pillar 424 passes through solder layer 44 and interacts with the Ni in the surface finish layer 39 to form bottom layer 52, and some of the Ni from the surface finish layer 39 passes through the solder layer 44 and interacts with the Cu in the copper pillar 424 to form top layer 50. In an embodiment, the metal interaction results in the top layer 50 and the bottom layer 52 of the first IMC 47 including the same material. For example, the top layer 50 and the bottom layer 52 may both include the same compound or compounds, which may be one or more of $(Cu, Ni, Au, Pd)_6Sn_5$. In similar fashion, metals from the copper pillar 424 and the surface finish layer 39 pass through the solder layer 44 to form the discontinuous second IMC 49.

The volume ratio of the combined volume of the first IMC 47 and the second IMC 49 to the volume of the solder layer 44 is controlled to be less than 80%, thereby avoiding joint crack and increasing mechanical reliability of the semiconductor flip-chip bonded device. In some embodiments, the volume ratio of the first IMC 47 to the solder layer 44 is greater than the volume ratio of the second IMC 49 to the solder layer 44. However, in other embodiments, a thickness of a layer or layers of the surface finish layer 39 (e.g., one or more of an Au, Pd or Pd/Au layer(s)) due to process tolerance may be such that the volume ratio of the first IMC 47 to the solder layer 44 is less than the volume ratio of the second IMC 49 to the solder layer 44.

The thickness of the first IMC 47 may be controlled during processing by controlling the thicknesses of the copper pillar 424, the surface finish layer 39, and the solder layer 44. "Thickness" in this context indicates a vertical dimension in the orientation shown in FIG. 2. Thus, given thicknesses $T_1$, $T_2$, and $T_3$ in FIG. 2 (thicknesses of the copper pillar 424, the solder layer 44, and the surface finish layer 39, respectively), the top layer 50 of the first IMC 47 will form to a thickness of $T_5$, and the bottom layer 52 of the first IMC 47 will form to a thickness of $T_6$. For example: a thickness $T_1$ of the copper pillar 424 is about 5 micrometers (μm) to about 20 μm; a thickness $T_2$ of the solder layer 44 is about 5 μm to about 30 μm; and a thickness $T_3$ of the surface finish layer 39 is about 1 μm to about 15 μm; such that the resulting thickness $T_5$ of the top layer 50 is about 2 μm to about 3 μm, and the resulting thickness $T_6$ of the bottom layer 52 is no greater than, or is less than $T_5$, and is about 1 μm to about 2 μm. Therefore, a combined thickness of the top layer 50 and the bottom layer 52 of the first IMC 47 is about 3 μm to about 5 μm, and the first IMC 47 can therefore be controlled such that it does not replace the solder layer 44 completely. Further, by controlling the thicknesses $T_1$, $T_2$, and $T_3$, a thickness of the second IMC 49 may be controlled, and may be controlled such that the combined thickness of the first IMC 47 and the second IMC 49 is less than the thickness of the solder layer 44 (i.e., the solder layer 44 is not completely replaced). In one embodiment, a thickness $T_4$ of the pad 3831 is about 1 μm to about 10 μm; however, the thickness of the pad 3831 does not significantly affect the thickness of the first IMC 47 or the second IMC 49 in this embodiment, by using the surface finish layer 39 to block migration of the Cu in pad 3831.

An additional benefit of controlling the intermetallic bonding to form the first IMC 47 and the second IMC 49 is that voids in the solder layer 44 are avoided; thus, the lifetime of the semiconductor flip-chip bonded device is increased.

Figure 3:
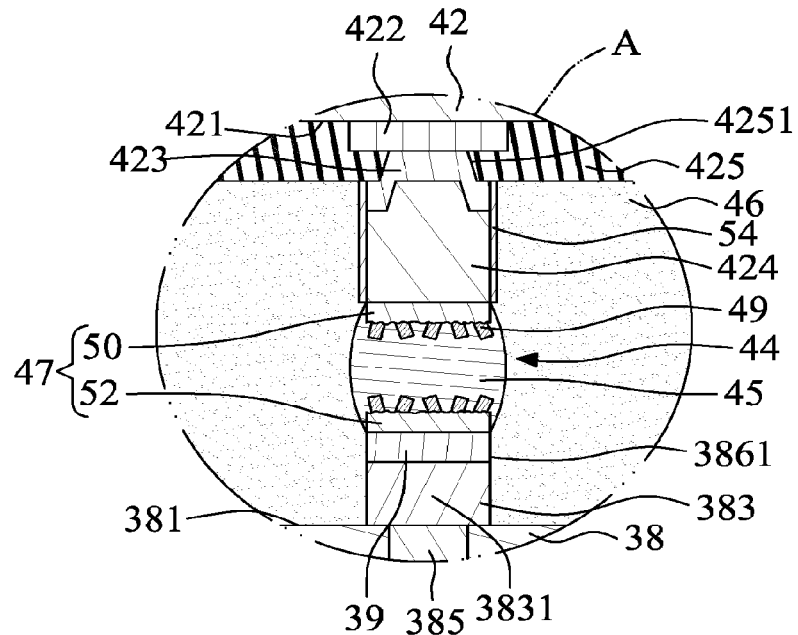
FIG. 3 illustrates a cross-sectional view of a semiconductor flip-chip bond according to another embodiment of the present disclosure.

Referring to FIG. 3, a cross-sectional view of a semiconductor flip-chip bonded device according to another embodiment of the present disclosure is illustrated. The semiconductor flip-chip bonded device of this embodiment is similar to the semiconductor flip-chip bonded device of FIG. 2, and the difference is that the copper pillar 424 has a circumferential protection layer 54 disposed on the sidewall of the copper pillar 424 to surround the copper pillar 424. The material of the circumferential protection layer 54 is a metal oxide, such as copper oxide, which is formed as follows: first, a mask layer is used to cover the bottom surface of the tip of the copper pillar 424. Then, the copper pillar 424 with the mask layer are placed into an oxidizing gas so that the circumferential protection layer 54 is formed on the sidewall of the copper pillar 424. After the mask layer is removed, the solder layer 44 is formed at the tip of the copper pillar 424.

Figure 4:
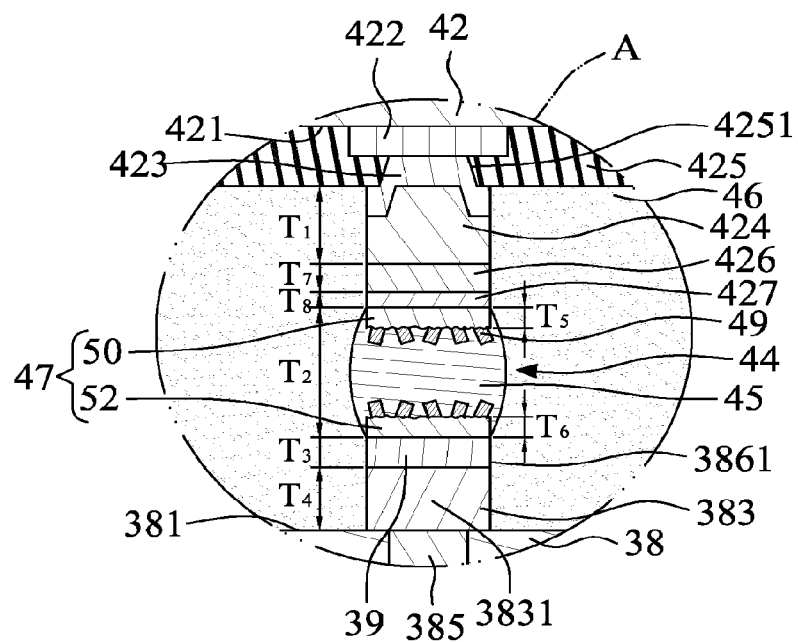
FIG. 4 illustrates a cross-sectional view of a semiconductor flip-chip bond according to another embodiment of the present disclosure.

Referring to FIG. 4, a cross-sectional view of a semiconductor flip-chip bonded device according to another embodiment of the present disclosure is illustrated. The semiconductor flip-chip bonded device of this embodiment is similar to the semiconductor flip-chip bonded device of FIG. 2, and the difference is that the semiconductor die 42 further includes a barrier layer 426 and a metal layer 427. The barrier layer 426 is disposed on a tip of the copper pillar 424, and the metal layer 427 is disposed (for example, coated) on the barrier layer 426. In an embodiment, the material of the barrier layer 426 is Ni, and the material of the metal layer 427 is the same as that of copper pillar 424, namely, both are Cu. Therefore, the top layer 50 of the first IMC 47 is formed on the metal layer 427 directly. In an embodiment, the material of the top layer 50 and the bottom layer 52 of the first IMC 47 is one or more of (Cu, Ni, Au, Pd)$_6$Sn$_5$, and the top layer 50 and the bottom layer 52 may be the same alloy. In addition, the copper pillar 424 of this embodiment may include a circumferential protection layer similar to the circumferential protection layer 54 illustrated in FIG. 3. In an embodiment, for controlling the thickness of the first IMC 47 and the second IMC 49, a thickness $T_7$ of the barrier layer 426 is about 1 μm to about 5 μm, and a thickness $T_8$ of the metal layer 427 is about 2 μm to about 8 μm.

Figure 5:
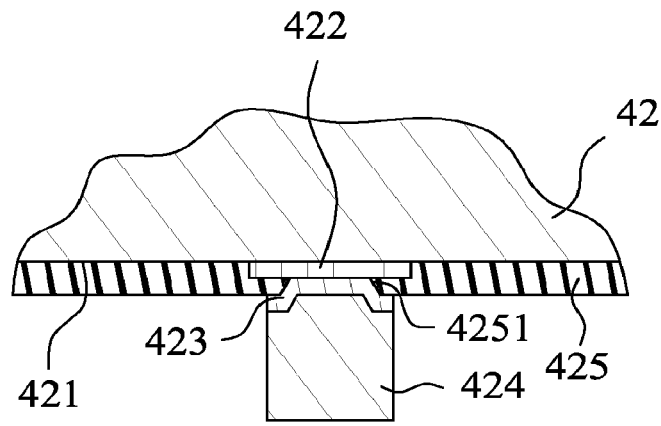
FIG. 5, FIG. 6 and FIG. 7 illustrate a method for manufacturing a semiconductor device according to an embodiment of the present disclosure.
Figure 6:
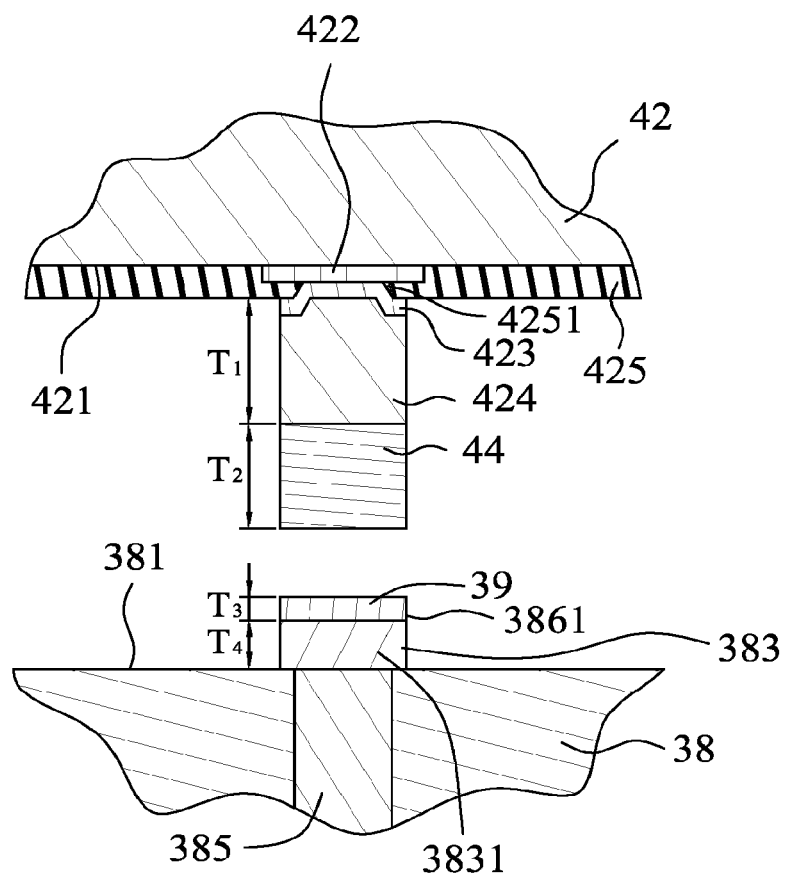
Figure 7:
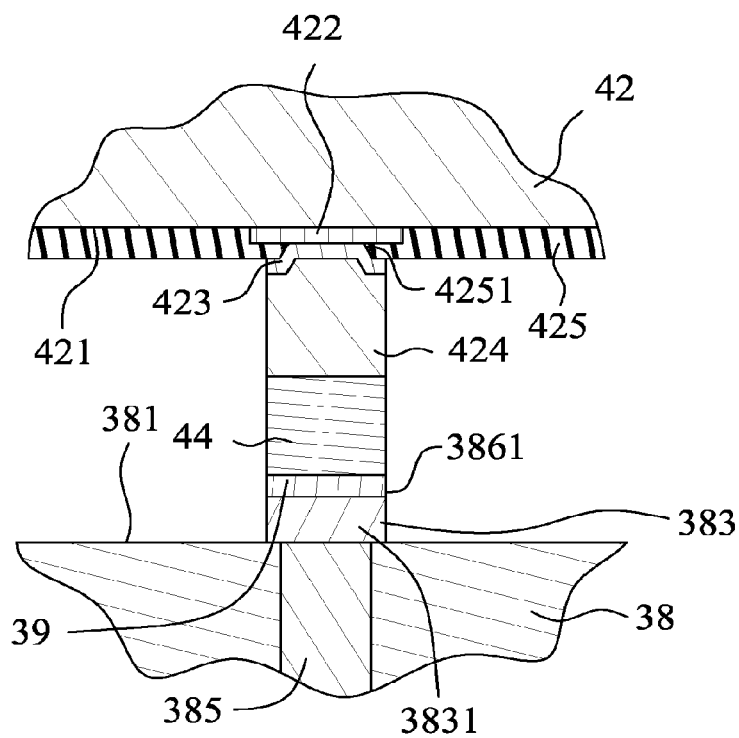

Referring to FIG. 5, FIG. 6 and FIG. 7, a method for manufacturing a semiconductor device according to an embodiment of the present disclosure is illustrated. This embodiment is used to manufacture a semiconductor flip-chip bonded device such as that shown in FIG. 2.

Referring to FIG. 5, a semiconductor die 42 is provided. In this embodiment, the semiconductor die 42 includes an active surface 421, a metal circuit layer 422, a seed layer 423, copper pillars 424 and a protection layer 425. The metal circuit layer 422 is disposed on the active surface 421. In this embodiment, the metal circuit layer 422 includes a plurality of segments insulated from each other, and the material of the segments is Al, Cu or AlCu. The protection layer 425 covers the active surface 421 and the metal circuit layer 422, and defines a plurality of openings 4251 to expose a portion of the metal circuit layer 422. In an embodiment, the protection layer 425 is a passivation layer of metal oxide. The copper pillars 424 are disposed adjacent to the metal circuit layer 422, and are electrically connected to the metal circuit layer 422. In this embodiment, the seed layer 423 is disposed on the metal circuit layer 422 in each of the openings 4251, and each of the copper pillars 424 is disposed on the seed layer 423. That is, the seed layer 423 is disposed between each of the copper pillars 424 and the metal circuit layer 422. However, the seed layer 423 may be omitted, and each of the copper pillars 424 may be disposed on the metal circuit layer 422 directly. In an embodiment, the material of the seed layer 423 is TiCu.

Referring to FIG. 6, a solder layer 44 is formed adjacent to a tip of the copper pillar 424. In this embodiment, the solder layer 44 is formed at the tip of the copper pillar 424. That is, there is no barrier layer, such as Ni layer, disposed on the tip of the copper pillar 424, so that the solder layer 44 contacts the tip of the copper pillar 424 directly. The material of the solder layer 44 is Sn or SnAg. The outer peripheral surface of the solder layer 44 is coplanar with the outer peripheral surface of the copper pillar 424, thus, the radius of the solder layer 44 is substantially the same as that of the copper pillar 424.

Then, the semiconductor element 38 is provided. In an embodiment, the semiconductor element 38 is an interposer, and includes one or more electrical contact(s) for electrically connecting to the semiconductor die 42. A portion of an upper circuit layer 383 of the semiconductor element 38 forms a pad 3831. In this embodiment, the semiconductor element 38 further includes a surface finish layer 39 disposed on the pad 3831. In an embodiment, the material of the surface finish layer 39 is a combination of Ni/Au, Ni/Pd or Ni/Pd/Au, and the material of the pad 3831 is Cu.

In the embodiment illustrated in FIG. 6, a thickness $T_1$ of the copper pillar 424 is about 5 μm to about 20 μm, the thickness $T_2$ of the solder layer 44 is about 5 μm to about 30 μm, the thickness $T_3$ of the surface finish layer 39 is about 1 μm to about 15 μm, and the thickness $T_4$ of the pad 3831 is about 1 μm to about 10 μm.

Referring to FIG. 7, the semiconductor die 42 is placed on the semiconductor element 38 such that the solder layer 44 on the copper pillar 424 contacts the surface finish layer 39 on the electrical contact (e.g., the pad 3831) of the semiconductor element 38. Then, reflow is performed to bond the copper pillar 424 with the solder layer 44, and to bond the solder layer 44 with the surface finish layer 39. The reflow forms the first IMC 47 and the second IMC 49 in the solder layer 44, leaving the main solder portion 45 between. In an embodiment, the material of the main solder portion 45 is Sn or SnAg, the first IMC 47 is made of combinations of Cu, Ni, and Sn and includes Cu$_6$Sn$_5$, and the second IMC 49 is AuSn$_4$ based, PdSn$_4$ based, or a combination thereof.

In the embodiment described by FIGS. 5 to 7, no barrier layer, such as a Ni layer, is coated on the tip of the copper pillar 424; thus, during the reflow process, the Cu in the copper pillar 424 and the Ni in the surface finish layer 39 will enter the solder layer 44 rapidly, so as to form the top layer 50 and the bottom layer 52 of the first IMC 47. In an embodiment, the material of each of the top layer 50 and the bottom layer 52 includes one or more of (Cu, Ni, Au, Pd)$_6$Sn$_5$, and both the top layer 50 and the bottom layer 52 may be the same material. According to the Gibb energy equation, if the energies of formation are different, the intermetallic compound with lower energy of formation and higher stability will be formed first. Because the energy of formation of (Cu, Ni, Au, Pd)$_6$Sn$_5$ is lower that of (Au, Pd, Ni)Sn$_4$, and because (Cu, Ni, Au, Pd)$_6$Sn$_5$ is more stable than (Au, Pd, Ni)Sn$_4$, the top layer 50 and the bottom layer 52 of the first IMC 47 (both in a form (Cu, Ni, Au, Pd)$_6$Sn$_5$) will be formed first.

In some embodiments, the maximum volume ratio of the Cu$_6$Sn$_5$ of the first IMC 47 (including the top layer 50 and the bottom layer 52) to the solder layer 44 is about 15%. Further, if the concentration of Cu in the solder layer 44 is more than one percent by weight (1 wt %), the formation of AuSn$_4$ and/or PdSn$_4$ will be suppressed. In an embodiment such as described with respect to FIGS. 5 to 7, where no barrier layer is coated on the tip of the copper pillar 424, the Cu from the copper pillar 424 may suppress formation of the second IMC 49. For example, during the reflow process, the Cu in the copper pillar 424 enters the solder layer 44 freely, the Cu in the solder layer 44 forms Cu$_6$Sn$_5$ first, and, consequently, the relatively large amount (e.g., greater than 1 wt %) of Cu remaining in the solder layer 44 suppresses the formation of AuSn$_4$ and/or PdSn$_4$. Thus, in some embodiments, the volume ratio of the first IMC 47 to the solder layer 44 will be greater than the volume ratio of the second IMC 49 to the solder layer 44. However, in other embodiments, a thickness of an Au, Pd or Pd/Au layer of the surface finish layer 39 due to process tolerance may be such that it counterbalances the Cu remaining in the solder layer 44, and thus formation of AuSn$_4$ and/or PdSn$_4$ is not suppressed. In such a case, the volume ratio of the first IMC 47 to the solder layer 44 may be less than the volume ratio of the second IMC 49 to the solder layer 44. Nevertheless, the volume ratio of the combination of the first IMC 47 and the second IMC 49 to the solder layer 44 may be controlled to be less than 80%, to avoid joint crack and to increase mechanical reliability of the semiconductor flip-chip bonded device.

Figure 8:
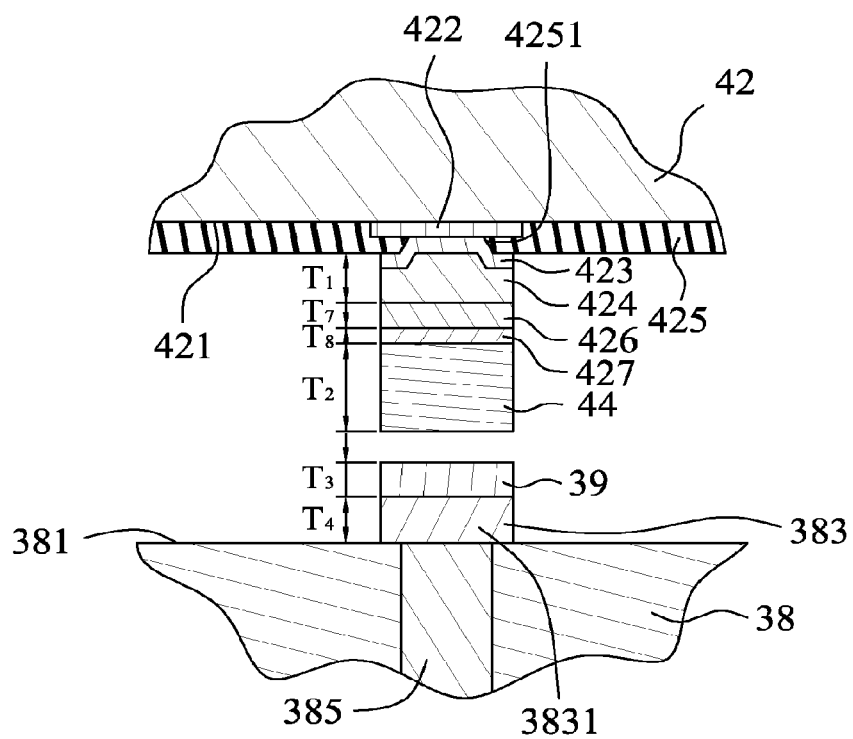
FIG. 8 illustrates a method for manufacturing a semiconductor device according to another embodiment of the present disclosure.

Referring to FIG. 8, a method for manufacturing a semiconductor device according to another embodiment of the present disclosure is illustrated. This embodiment is used to manufacture a semiconductor flip-chip bonded device such as that shown in FIG. 4. The method of this embodiment is similar to the method of FIGS. 5 to 7, and the difference is that the semiconductor die 42 further includes a barrier layer 426 and a metal layer 427. In an embodiment, the material of the barrier layer 426 is Ni, and the barrier layer 426 is disposed on a tip of the copper pillar 424. The material of the metal layer 427 is the same as that of copper pillar 424, namely, both are Cu. The metal layer 427 is disposed on the barrier layer 426. A thickness $T_7$ of the barrier layer 426 is about 1 μm to about 5 μm, and a thickness $T_8$ of the metal layer 427 is about 2 μm to about 8 μm. The solder layer 44 is disposed on the metal layer 427. In this embodiment, the outer peripheral surface of the solder layer 44 is coplanar with the outer peripheral surfaces of the copper pillar 424 and the metal layer 427, thus, the radius of the solder layer 44 is substantially the same as those of the copper pillar 424 and the metal layer 427.

In this embodiment, the relationship between the thickness $T_8$ of the metal layer 427 and the thickness $T_2$ of the solder layer 44 is about $T_8 \geq 0.09\ T_2$, which is derived as follows. In this embodiment, the barrier layer 426 is coated on the tip of the copper pillar 424, thus, during the reflow process, the Cu in the copper pillar 424 will not enter the solder layer 44. That is, the Cu in the solder layer 44 only, or primarily, comes from the copper metal layer 427.

The thickness $T_8$ of the copper metal layer 427 may be considered as a combination of a first portion and a second portion. A thickness of the first portion of the copper metal layer 427 is used to control the formation of $Cu_6Sn_5$, and a thickness of the second portion of the copper metal layer 427 is used to suppress the formation of $AuSn_4$ and/or $PdSn_4$. For convenience, the thickness of the first portion of the copper metal layer 427 is referred to herein as $T_{81}$, and the thickness of the second portion of the copper metal layer 427 is referred to herein as $T_{82}$.

$T_{81}$ is determined as follows. As stated above, in some embodiments, the maximum volume ratio of the $Cu_6Sn_5$ to the solder layer 44 is about 15%. Thus, $V_1=(0.15)\ V_2$, wherein $V_1$ represents the volume of the $Cu_6Sn_5$, and $V_2$ represents the volume of the solder layer 44. Because the volume ratio of Cu in the $Cu_6Sn_5$ is $$\frac{6}{11},$$

the volume of Cu is $$\frac{6}{11}V_1 = \left(\frac{6}{11}\right)(0.15)\ V_2.$$

In geometric terms, the volume of Cu is $\pi r^2 \times T_{81}$, and the volume of the solder layer 44 is $V_2 = \pi r^2 \times T_2$, wherein r represents the radius of the solder layer 44 (which is same as the radius of the copper metal layer 427). The two descriptions of volume of Cu are equated as in equation (1), and the thickness $T_{81}$ determined as in equation (2) by solving equation (1).

$$\pi r^2 \times T_{81} = \left(\frac{6}{11}\right)(0.15)V_2 = \left(\frac{6}{11}\right)(0.15)(\pi r^2 \times T_2) \quad (1)$$

$$T_{81} = \left(\frac{6}{11}\right)(0.15) \times T_2 = 0.0818\ T_2 \quad (2)$$

The thickness $T_{82}$ of the second portion of the copper metal layer 427 is determined as follows. As stated above, in some embodiments, if the concentration of Cu in the solder layer 44 is more than 1 wt %, the formation of $AuSn_4$ and/or $PdSn_4$ will be suppressed. Therefore, in some embodiments, suppression occurs when $$\frac{W1}{W1+W2} \geq \frac{1}{100}$$

(i.e., when 99 W1≥W2) wherein W1 represents the weight of Cu, and W2 represents the weight of SnAg. The weight of Cu is W1=$\pi r^2 \times T_{82} \times 8.96$, and the weight of the solder layer 44 is W2=$\pi r^2 \times T_2 \times 7.31$, wherein r represents the radius of the solder layer 44 (which is same as the radius of the copper metal layer 427), 8.96 is the density of Cu, and 7.31 is the density of SnAg. Equation (3) starts with the relationship 99 W1≥W2 and substitutes in the relationships for W1 and W2, and the thickness $T_{82}$ is solved for in equation (4).

$$99(\pi r^2 \times T_{82} \times 8.96) \geq (\pi r^2 \times T_2 \times 7.31) \quad (3)$$

$$T_{82} \geq 0.00824 T_2 \quad (4)$$

The thickness $T_8$ is the sum of the thicknesses $T_{81}$ and $T_{82}$, thus, from equations (2) and (4), $T_8=T_{81}+T_{82} \geq 0.0818\ T_2+0.00824\ T_2 \geq 0.09004\ T_2$. That is, the relationship between the thickness $T_8$ of the copper metal layer 427 and the thickness $T_2$ of the solder layer 44 is about $T_8 \geq 0.09\ T_2$.

Still referring to FIG. 8, the semiconductor die 42 is placed on the semiconductor element 38 such that the solder layer 44 contacts the surface finish layer 39 on the electrical contact (e.g., the pad 3831) of the semiconductor element 38. Then, reflow is performed to form the first IMC 47 and the second IMC 49 in the solder layer 44, along with the remaining main solder portion 45, such that the semiconductor flip-chip bonded device as shown in FIG. 4 is obtained. In this embodiment, the relationship between the thickness $T_8$ of the copper metal layer 427 and the thickness $T_2$ of the solder layer 44 satisfies the above-mentioned equation, $T_8 \geq 0.09\ T_2$, therefore, the volume ratio of the first IMC 47 and the second IMC 49 to the solder layer 44 is less than 80%, thereby avoiding joint crack and increasing mechanical reliability of the semiconductor flip-chip bonded device.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, one radius described as "substantially the same" as another radius indicates that the one radius is less than or equal to ±10% of the other radius, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
    a first circuit layer;
    a copper pillar disposed adjacent to the first circuit layer;
    a second circuit layer comprising an electrical contact and a surface finish layer disposed on the electrical contact, wherein a material of the surface finish layer is a combination of at least two of nickel, gold, and palladium; and
    a solder layer disposed between the copper pillar and the surface finish layer, the solder layer comprising a first intermetallic compound (IMC) and a second IMC, wherein the first IMC comprises a combination of two or more of copper, nickel and tin, the second IMC includes a combination of gold and tin, a combination of palladium and tin, or both, the first IMC comprises a top layer and a bottom layer, and materials of the top layer and the bottom layer are the same.

2. The semiconductor device of claim 1, wherein the top layer of the first IMC contacts the copper pillar, and the bottom layer of the first IMC contacts the surface finish layer.

3. The semiconductor device of claim 1, wherein the electrical contact is a copper pad.

4. The semiconductor device of claim 1, wherein a combined volume ratio of the first IMC and the second IMC to the solder layer is less than 80%.

5. The semiconductor device of claim 1, wherein the first IMC includes $Cu_6Sn_5$, and a volume ratio of the $Cu_6Sn_5$ of the first IMC to the solder layer is about 15%.

6. The semiconductor device of claim 1, wherein a thickness of the solder layer is about 5 µm to about 30 µm.

7. The semiconductor device of claim 1, wherein a volume ratio of the first IMC to the solder layer is greater than a volume ratio of the second IMC to the solder layer.

8. A semiconductor device, comprising:
    a first circuit layer comprising a protection layer exposing portions of the first circuit layer, and a seed layer disposed on the exposed portions of the first circuit layer;
    a copper pillar disposed on the seed layer;
    a second circuit layer comprising a pad and a surface finish layer disposed on the pad;
    a solder layer disposed between the copper pillar and the surface finish layer;
    a first intermetallic compound between the solder layer and the copper pillar; and
    a second intermetallic compound between the solder layer and the surface finish layer, a volume of the first intermetallic compound plus a volume of the second intermetallic compound being less than eighty percent (80%) of a volume of the solder layer, and the second intermetallic compound being discontinuous.

9. The semiconductor device of claim 8, wherein the first intermetallic compound comprises a combination of two or more of copper, nickel and tin, and the second intermetallic compound includes a combination of gold and tin, a combination of palladium and tin, or both.

10. The semiconductor device of claim 8, further comprising a substrate, wherein the first circuit layer is electrically connected to the substrate through the second circuit layer.

11. The semiconductor device of claim 10, further comprising a molding compound encapsulating the first circuit layer, the second circuit layer, and a portion of a surface of the substrate.

12. The semiconductor device of claim 8, wherein a volume ratio of the first intermetallic compound to the solder layer is greater than a volume ratio of the second intermetallic compound to the solder layer.

13. The semiconductor device of claim 8, wherein a thickness of the solder layer is about 5 µm to about 30 µm.

* * * * *